United States Patent
Ishioka et al.

(10) Patent No.: US 11,236,008 B2
(45) Date of Patent: Feb. 1, 2022

(54) GLASS

(71) Applicant: AGC Inc., Chiyoda-ku (JP)

(72) Inventors: Nanae Ishioka, Tokyo (JP); Masamichi Tanida, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 307 days.

(21) Appl. No.: 16/275,680

(22) Filed: Feb. 14, 2019

(65) Prior Publication Data
US 2019/0177207 A1 Jun. 13, 2019

Related U.S. Application Data

(63) Continuation of application No. PCT/JP2017/029322, filed on Aug. 14, 2017.

(30) Foreign Application Priority Data

Aug. 17, 2016 (JP) .............................. JP2016-160172
Aug. 3, 2017 (JP) .............................. JP2017-150677

(51) Int. Cl.
| | |
|---|---|
| *C03C 3/064* | (2006.01) |
| *H01G 4/30* | (2006.01) |
| *H01M 10/0562* | (2010.01) |
| *H01G 11/56* | (2013.01) |
| *H01G 4/12* | (2006.01) |
| *C03C 8/14* | (2006.01) |
| *C03C 8/02* | (2006.01) |
| *C03C 3/062* | (2006.01) |
| *C03C 3/19* | (2006.01) |
| *C03C 3/14* | (2006.01) |
| *H01B 1/06* | (2006.01) |
| *C03C 3/23* | (2006.01) |
| *C03C 4/14* | (2006.01) |
| *C03C 4/18* | (2006.01) |
| *C03C 8/06* | (2006.01) |
| *C03C 8/08* | (2006.01) |
| *H01G 4/005* | (2006.01) |
| *H01G 4/228* | (2006.01) |
| *H05K 1/03* | (2006.01) |
| *H05K 1/11* | (2006.01) |
| *H05K 1/18* | (2006.01) |
| *H05K 3/00* | (2006.01) |
| *H05K 3/46* | (2006.01) |

(52) U.S. Cl.
CPC .............. *C03C 3/064* (2013.01); *C03C 3/062* (2013.01); *C03C 3/14* (2013.01); *C03C 3/19* (2013.01); *C03C 3/23* (2013.01); *C03C 4/14* (2013.01); *C03C 4/18* (2013.01); *C03C 8/02* (2013.01); *C03C 8/06* (2013.01); *C03C 8/08* (2013.01); *C03C 8/14* (2013.01); *H01B 1/06* (2013.01); *H01G 4/12* (2013.01); *H01G 4/30* (2013.01); *H01G 11/56* (2013.01); *H01M 10/0562* (2013.01); *C03C 2204/00* (2013.01); *C03C 2205/00* (2013.01); *H01G 4/005* (2013.01); *H01G 4/1227* (2013.01); *H01G 4/228* (2013.01); *H01M 2300/008* (2013.01); *H01M 2300/0091* (2013.01); *H05K 1/0306* (2013.01); *H05K 1/112* (2013.01); *H05K 1/181* (2013.01); *H05K 1/185* (2013.01); *H05K 3/0047* (2013.01); *H05K 3/4644* (2013.01)

(58) Field of Classification Search
CPC .. C03C 3/064; C03C 3/23; C03C 3/14; C03C 4/14; C03C 4/18; C03C 8/06; C03C 8/14; C03C 2204/00; C03C 2205/00
See application file for complete search history.

(56) References Cited

U.S. PATENT DOCUMENTS

| 4,474,686 A | 10/1984 | Miyauchi et al. |
| 2002/0025439 A1 | 2/2002 | Ueda et al. |
| 2009/0011339 A1 | 1/2009 | Seino et al. |
| 2014/0216631 A1 | 8/2014 | Teraoka et al. |

FOREIGN PATENT DOCUMENTS

| FR | 2 387 192 | 11/1978 |
| JP | 55-121928 | 9/1980 |
| JP | 3-61286 | 9/1991 |
| JP | 8-198638 A | 8/1996 |
| JP | 2000-281436 | 10/2000 |
| JP | 2012-142228 A | 7/2012 |

(Continued)

OTHER PUBLICATIONS

K. Otto, "Electrical Conductivity of $SiO_2$-$B_2O_3$ Glasses Containing Lithium or Sodium" Physics and Chemistry of Glasses, vol. 7, No. 1, Feb. 1966, pp. 29-37 and cover pages.
Gaetano Chiodelli, et al., "Ionic Conductivity and Glass Transition of Borophosphate Glasses", Solid State Ionics 18 & 19, 1986, pp. 356-361.
Partial European Search Report dated Mar. 13, 2020 in European Patent Application No. 17841493.4, 13 pages.
Gundale, S.S., et al., "Study of Electrical Conductivity of $Li_2O$-$B_2O_3$-$SiO_2$-$Li_2SO_4$ glasses and glass-ceramics", Solid State Ionics, vol. 298, Nov. 12, 2016, XP029841040, pp. 57-62.
International Search Report dated Oct. 31, 2017 in PCT/JP2017/029322, filed Aug. 14, 2017 (with English Translation).

(Continued)

*Primary Examiner* — Elizabeth A. Bolden
(74) *Attorney, Agent, or Firm* — Oblon, McClelland, Maier & Neustadt, L.L.P.

(57) ABSTRACT

The present invention pertains to a glass characterized by: containing 72-82% of $Li^+$, 0-21% of $Si^{4+}$, and 0-28% of $B^{3+}$ in terms of cation %; and containing at least 70% and less than 100% of $O^{2-}$ and more than 0% and at most 30% of $Cl^-$, containing at least 94% and less than 100% of $O^{2-}$ and more than 0% and at most 6% of $S^{2-}$, or containing at least 64% and less than 100% of $O^{2-}$, more than 0% and at most 30% of $Cl^-$, and more than 0% and at most 6% of $S^{2-}$, in terms of anion %.

6 Claims, 3 Drawing Sheets

(56) References Cited

FOREIGN PATENT DOCUMENTS

| | | |
|---|---|---|
| JP | 2014-154236 A | 8/2014 |
| JP | 2015-63447 | 4/2015 |
| KR | 2013-0025362 | 3/2013 |
| KR | 2014-0025542 | 3/2014 |
| WO | WO 2006/075567 A1 | 7/2006 |

OTHER PUBLICATIONS

Written Opinion dated Oct. 31, 2017 in PCT/JP2017/029322, filed Aug. 14, 2017.
Chryssikos, G., et al. "Effect of $Li_2SO_4$ on the structure of $Li_2O$-$B_2O_3$ glasses", Journal of Non-Crystalline Solids, vol. 202, 1996, pp. 222-232.
Rao., K., et al. "Investigation of lithium chloride-lithium borate-tellurium dioxide glasses: an example of complex anionic speciation", Physics and Chemistry of Glasses, vol. 42, No. 3, 2001, pp. 255-264.

GLASS

TECHNICAL FIELD

The present invention relates to a glass, particularly a glass which can be sintered at low temperatures and is suitable as a binder glass for binding in the case of manufacturing a high-density circuit substrate, and a glass which is suitable as a lithium ion conductive glass owing to its high lithium ion conductivity, and relates to a solid electrolyte containing the glass.

BACKGROUND ART

Glass materials can be softened and fused at relatively low temperatures unlike ceramic materials composed of crystals. Utilizing this property, glass powders have been widely used as binding materials for ceramic powders or electrode powders of low-temperature co-fired ceramic multilayer substrates. The glass materials are essential to integrally form high-density circuit substrates composed of highly reliable inorganic materials.

Patent Document 1 proposes a ceramic multilayer substrate having a low sintering temperature, a high substrate strength and excellent substrate characteristics by mixing glass components consisting of barium oxide, silicon oxide and boron oxide with a dielectric ceramic component. However, the glass has a high softening point and has been unable to be sufficiently sintered at low temperatures.

In order to lower the softening point of glass, addition of an alkali metal element to a glass composition is effective, and especially, lithium is the most effective. However, a glass containing a large amount of lithium has poor electric insulation properties, so that use thereof as an insulating material has been avoided. However, the glass containing a large amount of lithium can be expected as a glass powder having excellent low-temperature sinterability, because of its low softening point. In a high-density circuit substrate, it can be expected to function as a dielectric or insulator layer having excellent low-temperature sinterability by mixing the glass powder with a functional ceramic powder, and it can be expected to function as a conductive layer having excellent low-temperature sinterability by mixing the glass powder with a conductive powder such as a metal.

On the other hand, the glass containing an alkali metal element, particularly a large amount of lithium can be expected to also function as a solid electrolyte having a high ion conductivity. For example, conventionally, liquid electrolytes of organic solvents such as ethylene carbonate, diethyl carbonate and methyl ethyl carbonate have been used as electrolytes for lithium-ion secondary batteries. However, these organic solvent-based liquid electrolytes are flammable and may possibly fire. In addition, the organic solvent-based liquid electrolytes are easily decomposed or altered in quality when a high voltage is applied thereon.

Therefore, an inorganic solid electrolyte which is non-flammable and has high stability against voltage application is expected as an electrolyte for a next-generation lithium-ion secondary battery. Then, a solid electrolyte composed of an oxide glass or glass ceramic is proposed as the inorganic solid electrolyte.

Patent Document 2 proposes a lithium-ion conductive glass containing $Li^+$, $B^{3+}$, $P^{5+}$, $Ta^{5+}$, $Nb_{5+}$, $V^{5+}$ and $Ge^{4+}$, respectively, at predetermined ratios as cations.

Patent Document 3 proposes a lithium oxide amorphous ion conductor which is a ternary composition consisting of LiO, $SiO_2$ and $ZrO_2$, in which the ratios of respective components are defined to specific ranges.

PRIOR ART DOCUMENTS

Patent Documents

Patent Document 1: JP-A-2000-281436
Patent Document 2: JP-A-2015-63447
Patent Document 3: JP-B-H03-61286

SUMMARY OF THE INVENTION

Problems that the Invention is to Solve

However, the glass or the amorphous ion conductor described in Patent Document 2 and Patent Document 3, respectively, cannot be said to have a sufficiently high ion conductivity, and improvement thereof has been demanded.

The present invention has been made to solve such a problem, and an object thereof is to provide a glass suitable for a binder glass for binding or a lithium ion conductive glass, which can be sintered at low temperatures, has a high ion conductivity and is suitable for a high-density circuit substrate, and to provide a solid electrolyte containing the glass.

Means for Solving the Problems

As a first glass, the present invention provides a glass including, as represented by cation %: 72% or more and 82% or less of $Li^+$, 0% or more and 21% or less of $Si^{4+}$, and 0% or more and 28% or less of $B^{3+}$, and, including, as represented by anion %: 70% or more and less than 100% of $O^{2-}$ and more than 0% and 30% or less of $Cl^-$.

As a second glass, the present invention provides a glass including, as represented by cation %: 72% or more and 82% or less of $Li^+$, 0% or more and 21% or less of $Si^{4+}$, and 0% or more and 28% or less of $B^{3+}$, and, including, as represented by anion %: 94% or more and less than 100% of $O^{2-}$ and more than 0% and 6% or less of $S^{2-}$.

As a third glass, the present invention provides a glass including, as represented by cation %: 72% or more and 82% or less of $Li^+$, 0% or more and 21% or less of $Si^{4+}$, and 0% or more and 28% or less of $B^{3+}$, and, including, as represented by anion %: 64% or more and less than 100% of $O^{2-}$, more than 0% and 30% or less of $Cl^-$, and more than 0% and 6% or less of $S^{2-}$.

As a forth glass, the present invention provides a glass including, as represented by cation %: 50% or more and less than 72% of $Li^+$, more than 0% and 7% or less of $Si^{4+}$, and more than 21% and 50% or less of $B^{3+}$, and, including, as represented by anion %: 70% or more and less than 100% of $O^{2-}$ and more than 0% and 30% or less of $Cl^-$.

As a fifth glass, the present invention provides a glass including, as represented by cation %: 50% or more and less than 72% of $Li^+$, more than 0% and 7% or less of $Si^{4+}$, and more than 21% and 50% or less of $B^{3+}$, and, including, as represented by anion %: 94% or more and less than 100% of $O^{2-}$ and more than 0% and 6% or less of $S^{2-}$.

As a sixth glass, the present invention provides a glass including, as represented by cation %: 50% or more and less than 72% of $Li^+$, more than 0% and 7% or less of $Si^{4+}$, and more than 21% and 50% or less of $B^{3+}$, and, including, as represented by anion %: 64% or more and less than 100% of $O^{2-}$, more than 0% and 30% or less of $Cl^-$, and more than 0% and 6% or less of $S^{2-}$.

As a seventh glass, the present invention provides a glass including $(LiCl)_2$, $Li_2O$, $B_2O_3$, and $P_2O_5$ as essential components and including $SiO_2$ as an optional component, in which, when the content of each component in the glass is represented by mol %, $\{Li_2O/(B_2O_3+P_2O_5)\}$ is 0.6 or more and 1.2 or less, $\{P_2O_5/(B_2O_3+P_2O_5)\}$ is more than 0.0 and less than 0.7, $(LiCl)_2$ is more than 0% and 30% or less, and $\{(LiCl)_2+Li_2O+B_2O_3+P_2O_5+SiO_2\}$ is 90% or more.

As an eighth glass, the present invention provides a glass including $(LiCl)_2$, $Li_2O$, and $B_2O_3$ as essential components and including substantially no $P_2O_5$, in which, when the content of each component in the glass is represented by mol %, $\{(LiCl)_2/Li_2O\}$ is 0.430 or more and 1.000 or less, $(Li_2O/B_2O_3)$ is 0.95 or more and 1.05 or less, and $\{(LiCl)_2+Li_2O+B_2O_3\}$ is 90% or more.

The valences of the cation and anion in the glass may fluctuate according to a state. However, description of the valences in ion notation of element symbols of the cations and anions of the present invention is expressed by their typical valences.

In the glass of the present invention, when the glass transition point of the glass is taken as Tg and the crystallization peak temperature of the glass is taken as Tc, (Tc−Tg) is preferably 55° C. or higher in terms of stabilization of the glass.

Tg of the glass of the present invention is preferably from 200 to 450° C. in terms of securing good low-temperature sinterability. In the glass of the present invention, the ion conductivity is preferably $7.0 \times 10^{-7}$ S/cm or more.

In addition, the solid electrolyte containing the glass of the present invention is preferred as an electrolyte, and the glass of the present invention is preferred as a binder for binding electrode materials and functional ceramic materials.

Advantageous Effect of the Invention

The glass of the present invention is nonflammable, has high stability against voltage application, has high stability as a glass, has high sinterability, and further, has an excellent ion conductivity.

By using the glass of the present invention as a binder glass for binding, even in the case where a functional ceramic or electrode material which is easily deteriorated at high temperatures is contained, a dense laminated ceramic capacitor or a low-temperature co-fired ceramic multilayer substrate can be stably obtained. In addition, by using the glass of the present invention as a solid electrolyte, a lithium-ion secondary battery with high battery performance can be obtained.

MODE FOR CARRYING OUT THE INVENTION

Figure 1:
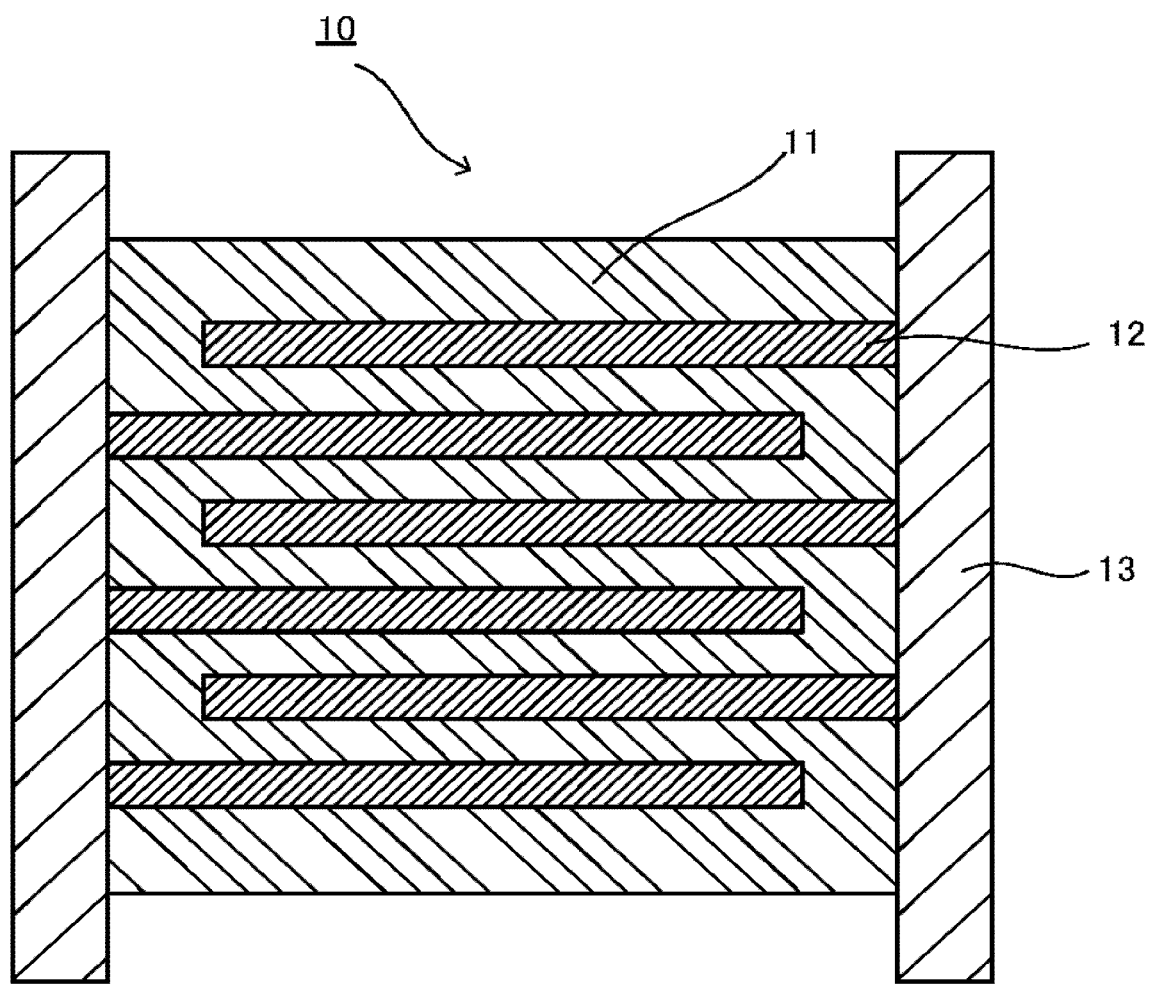
FIG. 1 is a view schematically illustrating an example in which a glass of the present invention is used in a laminated ceramic capacitor.

Embodiments of the present invention will be described below.

<Glass>

A first glass, second glass and third glass of the present invention all contain, as represented by cation %, 72% or more and 82% or less of $Li^+$, 0% or more and 21% or less of $Si^{4+}$, and 0% or more and 28% or less of $B^{3+}$, and respectively contain respective anion components at ratios of the following (a1), (a2) and (a3), as represented by anion %.

(a1) 70% or more and less than 100% of $O^{2-}$ and more than 0% and 30% or less of $Cl^-$ are contained.

(a2) 94% or more and less than 100% of $O^{2-}$ and more than 0% and 6% or less of $S^{2-}$ are contained.

(a3) 64% or more and less than 100% of $O^{2-}$, more than 0% and 30% or less of $Cl^-$, and more than 0% and 6% or less of $S^{2-}$ are contained.

In addition, a forth glass, fifth glass and sixth glass of the present invention all contain, as represented by cation %, 50% or more and less than 72% of $Li^+$, more than 0% and 7% or less of $Si^{4+}$, and more than 21% and 50% or less of $B^{3+}$, and respectively contain respective anion components at ratios of the above (a1), (a2) and (a3), as represented by anion %.

A seventh glass of the present invention is a glass containing $(LiCl)_2$, $Li_2O$, $B_2O_3$ and $P_2O_5$ as essential components and containing $SiO_2$ as an optional component, in which, when represented by mol %, the content of each component fulfills all of the following requirements of (7-1) to (7-4).

$\{Li_2O/(B_2O_3+P_2O_5)\}$ is 0.6 or more and 1.2 or less. (7-1)

$\{P_2O_5/(B_2O_3+P_2O_5)\}$ is more than 0.0 and less than 0.7. (7-2)

$(LiCl)_2$ is more than 0% and 30% or less. (7-3)

$\{(LiCl)_2+Li_2O+B_2O_3+P_2O_5+SiO_2\}$ is 90% or more. (7-4)

An eighth glass of the present invention is a glass containing $(LiCl)_2$, $Li_2O$ and $B_2O_3$ as essential components and substantially containing no $P_2O_5$, in which, when represented by mol %, the content of each component fulfills all of the following requirements of (8-1) to (8-3).

$\{(LiCl)_2/Li_2O\}$ is 0.430 or more and 1.000 or less. (8-1)

$(Li_2O/B_2O_3)$ is 0.95 or more and 1.05 or less. (8-2)

$\{(LiCl)_2+Li_2O+B_2O_3\}$ is 90% or more. (8-3)

When the glass of the present invention is described below, it shall include the first to eighth glasses.

In this description, the words "cation %" and "anion %" are units as described below. First, constituents of the glass are divided into cation components and anion components. Then, the "cation %" is a unit which represents the contained molar amount of each cation component by percentage, when the total contained molar amount of the total cation components contained in the glass is taken as 100%. The "anion %" is a unit which represents the contained molar amount of each anion component by percentage, when the total contained molar amount of the total anion components contained in the glass is taken as 100%.

In this description, the "mol %" is a unit which represents the contained molar amount of each constituent by percentage, when the total contained molar amount of the total constituents of the glass is taken as 100 mol %.

The content of each cation component in the glass of the present invention is determined from a result of inductively coupled plasma (ICP-AES: Inductively Coupled Plasma- Atomic Emission Spectroscopy) analysis of the glass obtained. In addition, the content of each anion component is determined from a result of quartz tube combustion ion chromatography.

The cation components and anion components of the first glass to the sixth glass of the present invention are described below.

(Cation Components)

In the first glass to third glass of the present invention, $Li^+$ is an element for lowering Tg, and further, is essential for realizing a high ion conductivity. The content of $Li^+$ in the cation components is 72% or more and 82% or less. In the case where the content of $Li^+$ is 72% or more, a high ion conductivity is realizable, and in the case of 82% or less, stability as glass is maintained. The content of $Li^+$ is preferably 74% or more and 81% or less, and more preferably 75% or more and 80% or less.

In the first glass to third glass of the present invention, $Si^{4+}$ is a glass forming element. The content of $Si^{4+}$ in the cation components is 0% or more and 21% or less. In the case where $Si^{4+}$ is contained, stability as glass is easily maintained, and in the case where the content thereof is 21% or less, a high ion conductivity is realizable. The content of $Si^{4+}$ is preferably 3% or more and 18% or less, and more preferably 6% or more and 15% or less.

In the first glass to third glass of the present invention, $B^{3+}$ is a glass forming element. The content of $B^{3+}$ in the cation components is 0% or more and 28% or less. In the case where $B^{3+}$ is contained, stability as glass is easily maintained, and in the case where the content thereof is 28% or less, a high ion conductivity is realizable. The content of $B^{3+}$ is preferably 5% or more and 24% or less, and more preferably 7% or more and 20% or less.

$Si^{4+}$ and $B^{3+}$ are glass forming elements, and stabilize the glass. The total content of $Si^{4+}$ and $B^{3+}$ is preferably 5% or more, and more preferably 7% or more. In addition, in order to realize a high ion conductivity, the total content of $Si^{4+}$ and $B^{3+}$ is preferably 28% or less, and more preferably 26% or less.

In the fourth glass to sixth glass of the present invention, $Li^+$ is an element for lowering Tg, and further, is essential for realizing a high ion conductivity. The content of $Li^+$ in the cation components is 50% or more and less than 72%. In the case where the content of $Li^+$ is 50% or more, a high ion conductivity is realizable, and in the case of less than 72%, stability as glass is maintained. The content of $Li^+$ is preferably 51.5% or more and 65% or less, and more preferably 52% or more and 64% or less.

In the fourth glass to sixth glass of the present invention, $Si^{4+}$ is a glass forming element, and is essential. The content of $Si^{4+}$ in the cation components is more than 0% and 7% or less. In the case where the content of $Si^{4+}$ is more than 0%, stability as glass is maintained, and in the case of 7% or less, a high ion conductivity is realizable. The content of $Si^{4+}$ is preferably 3% or more and 6.5% or less, and more preferably 4% or more and 6% or less.

In the fourth glass to sixth glass of the present invention, $B^{3+}$ is a glass forming element, and is essential. The content of $B^{3+}$ in the cation components is more than 21% and 50% or less. In the case where the content of $B^{3+}$ is more than 21%, stability as glass is maintained, and in the case of 50% or less, a high ion conductivity is realizable. The content of $B^{3+}$ is preferably 25% or more and 45% or less, and more preferably 30% or more and 43% or less.

In the first glass to sixth glass of the present invention, the cation components may consist of the above-mentioned cation components, and may optionally contain an additional cation. The kind of the additional cation and the content thereof is any cation with its content, as long as it does not impair the effects of the glass of the present invention.

The additional cations which can be contained in the first glass to sixth glass of the present invention, except for $Li^+$, $Si^{4+}$ and $B^{3+}$, specifically include $Zr^{4+}$, $Ge^{4+}$, $P^{5+}$, $Ta^{5+}$, $W^{6+}$, $Fe^{2+}$, $Fe^{3+}$, $Sc^{3+}$, $Y^{3+}$, $La^{3+}$, $Ce^{3+}$, $Ce^{4+}$, $Gd^{3+}$, $Ti^{4+}$, $Cr^{3+}$, $Mn^{2+}$, $Mn^{3+}$, $Mn^{4+}$, $Co^{2+}$, $Co^{3+}$, $Ni^{2+}$, $Ni^{3+}$, $Cu^{2+}$, $Zn^{2+}$, $Al^{3+}$, $Ga^{3+}$, $In^{3+}$, $Sn^{2+}$, $Sn^{4+}$, $Sb^{3+}$, $Sb^{5+}$, $Bi^{3+}$, etc.

(Anion Components)

The first glass to sixth glass of the present invention are characterized by being mainly composed of oxides. Oxides have high chemical stability, and can be used in electrochemical devices having high safety. However, in oxide glass, $O^{2-}$ is considered to largely restrain $Li^+$. It is considered that the conductivity of $Li^+$ can be improved by replacing the oxygen ion with an anion having smaller restraint to $Li^+$.

When a consideration is made from the viewpoint of electronegativity, restraining force to $Li^+$ is decreased at an electronegativity equivalent to or lower than that of oxygen. It is considered that $Cl^-$ having an electronegativity of 3.0 and $S^{2-}$ having an electronegativity of 2.5 can improve the conductivity of $Li^+$, because of their electronegativity lower than that (3.5) of oxygen.

The anion compositions of the first glass to sixth glass of the present invention are specifically the following (a1) (the first glass and fourth glass), (a2) (the second glass and fifth glass), or (a3) (the third glass and sixth glass).

(a1) 70% or more and less than 100% of $O^{2-}$ and more than 0% and 30% or less of $Cl^-$ are contained.

(a2) 94% or more and less than 100% of $O^{2-}$ and more than 0% and 6% or less of $S^{2-}$ are contained.

(a3) 64% or more and less than 100% of $O^{2-}$, more than 00/% and 30% or less of $Cl^-$, and more than 0% and 6% or less of $S^{2-}$ are contained.

(a1) is a composition in the case where $O^{2-}$ is partially exchanged to $Cl^-$. In the case of (a1), that is, in the case of the first and fourth glasses, the content of $O^{2-}$ in the anion components is 70% or more and less than 100%. The content of $Cl^-$ is more than 0% and 30% or less. In the case where the content of $O^{2-}$ in the anion components is 70% or more and the content of $Cl^-$ is 30% or less, stability as glass can be maintained.

In the case of (a1), the content of $O^{2-}$ is preferably 75% or more and 99% or less, and more preferably 80% or more and 98% or less.

In the case of (a1), the content of $Cl^-$ is more than 0% and 30% or less. In the case where the content of $Cl^-$ is more than 0%, the mixed anion effect of $O^{2-}$ and $Cl^-$ can be obtained. In the case where the content of $Cl^-$ is 30% or less, stability as glass is maintained. The content of $Cl^-$ is preferably 1% or more and 25% or less, and more preferably 2% or more and 20% or less.

(a2) is a composition in the case where $O^{2-}$ is partially exchanged to $S^{2-}$. In the case of (a2), that is, in the case of the second and fifth glasses, the content of $O^{2-}$ in the anion components is 94% or more and less than 100%. The content of $S^{2-}$ is more than 0% and 6% or less. In the case where the content of $O^{2-}$ in the anion components is 94% or more and the content of $S^{2-}$ is 6% or less, stability as glass can be maintained.

In the case of (a2), the content of $O^{2-}$ is preferably 96% or more and 99.5% or less, and more preferably 97% or more and 99% or less.

In the case of (a2), the content of $S^{2-}$ is more than 0% and 6% or less. In the case where the content of $S^{2-}$ is more than 0%, the mixed anion effect of $O^{2-}$ and $S^{2-}$ can be obtained. In the case where the content of $S^{2-}$ is 6% or less, stability as glass is maintained. The content of $S^{2-}$ is preferably 0.5% or more and 4% or less, and more preferably 1% or more and 3% or less.

(a3) is a composition in the case where $O^{2-}$ is partially exchanged to $Cl^-$ and $S^{2-}$. In the case of (a3), that is, in the case of the third and sixth glasses, the content of $O^{2-}$ in the anion components is 64% or more and less than 100%. The content of $Cl^-$ is more than 0% and 30% or less, and the content of $S^{2-}$ is more than 0% and 6% or less. In the case where the content of $O^{2-}$ in the anion components is 64% or more, the content of $Cl^-$ is 30% or less, and the content of $S^{2-}$ is 6% or less, stability as glass can be maintained.

In the case of (a3), the content of $O^{2-}$ is preferably 75% or more and 98.5% or less, and more preferably 80% or more and 97% or less.

In the case of (a3), the content of $Cl^-$ is more than 0% and 30% or less, and the content of $S^{2-}$ is more than 0% and 6% or less. In the case where the content of $Cl^-$ is more than 0% and the content of $S^{2-}$ is more than 0%, the mixed anion effect of $O^2$, $Cl^-$, and $S^{2-}$ can be obtained. In the case where the content of $Cl^-$ is 30% or less and the content of $S^{2-}$ is 6% or less, stability as glass is maintained. The content of $Cl^-$ is preferably 1% or more and 24.5% or less, and more preferably 2% or more and 19% or less. The content of $S^{2-}$ is preferably 0.5% or more and 4% or less, and more preferably 1% or more and 3% or less.

The first glass to sixth glass of the present invention contain the cation components mainly composed of $Li^+$, $Si^{4+}$ and $B^{3+}$ and have compositions containing $O^{2-}$ and $Cl^-$ and/or $S^{2-}$ as the anion components, in the above-mentioned specific compositions, thereby being high in stability as glass, and also excellent in ion conductivity.

Among the first glass to sixth glass of the present invention, the glass containing the cation components mainly composed of $Li^+$, $Si^{4+}$ and $B^{3+}$ and having the composition containing $O^{2-}$ and $Cl^-$ as the anion components, in the above-mentioned specific composition, is thereby high in stability as glass, and also excellent in ion conductivity.

Next, the seventh glass and eighth glass of the present invention are described. In the description of the compositions of the seventh glass and eighth glass, "%" in the content of each component is "mol %", unless otherwise specified.

The seventh glass of the present invention is a glass containing $(LiCl)_2$, $Li_2O$, $B_2O_3$ and $P_2O_5$ as essential components, and containing $SiO_2$ as an optional component, in which, when represented by mol %, the content of each component fulfills all of the above-mentioned requirements of (7-1) to (7-4). In the case where all of the requirements of (7-1) to (7-4) are fulfilled, the seventh glass of the present invention is high in stability as glass, and also excellent in ion conductivity.

In the requirement of (7-1), the ratio of the contained molar amount of $Li_2O$ to the total contained molar amount of $B_2O_3$ and $P_2O_5$, which is represented by $Li_2O/(B_2O_3+P_2O_5)$, of the seventh glass is 0.6 or more and 1.2 or less. In the case where $Li_2O/(B_2O_3+P_2O_5)$ is 0.6 or more, a high ion conductivity is realizable, and in the case of 1.2 or less, stability as glass is maintained. $Li_2O/(B_2O_3+P_2O_5)$ is preferably 0.7 or more and 1.1 or less, and more preferably 0.8 or more and 1.0 or less.

In addition, $Li_2O/(B_2O_3+P_2O_5)$ indicates the ratio of Li to the total of B and P which are the cations forming the glass, and in the case where this ratio is close to 1, non-crosslinking oxygen which cleaves a glass network structure is less likely to be formed. Further, the amount of Li which is hard to electrically move can be minimized.

In the requirement of (7-3), the content of $(LiCl)_2$ in the seventh glass is more than 0% and 30% or less. In the case where the content of $(LiCl)_2$ is more than 0%, a high ion conductivity is realizable, and in the case of 30% or less, stability as glass is maintained. The content of $(LiCl)_2$ is preferably 10% or more and 28% or less, and more preferably 14% or more and 26% or less.

In the requirement of (7-2), the ratio of the content of $P_2O_5$ to the total content of $B_2O_3$ and $P_2O_5$, which is represented by $P_2O_5/(B_2O_3+P_2O_5)$, of the seventh glass is more than 0.0 and less than 0.7. In the case where $P_2O_5/(B_2O_3+P_2O_5)$ is more than 0.0, a high ion conductivity is realizable, and in the case of less than 0.7, stability as glass is maintained. $P_2O_5/(B_2O_3+P_2O_5)$ is preferably 0.1 or more and 0.65 or less, and more preferably 0.2 or more and 0.60 or less.

In the requirement of (7-4), the total content of $(LiCl)_2$, $Li_2O$, $B_2O_3$, $P_2O_5$, and $SiO_2$, which is represented by $(LiCl)_2+Li_2O+B_2O_3+P_2O_5+SiO_2$, of the seventh glass is 90% or more. In the case where the total content is 90% or more, both high conductivity and stability of the glass can be satisfied. The total content is preferably 92% or more, and more preferably 94% or more.

In the case where the seventh glass contains $SiO_2$, the content thereof is preferably more than 0% and 10% or less. In the case where the content of $SiO_2$ is more than 0%, stability as glass is maintained, and in the case of 10% or less, a high ion conductivity is realizable. The content of $SiO_2$ is more preferably 1% or more and 9% or less, and still more preferably 2% or more and 7% or less.

The seventh glass may contain an additional component other than $(LiCl)_2$, $Li_2O$, $B_2O_3$, $P_2O_5$, and $SiO_2$. The content of the additional component is 10% or less, preferably 8% or less, and more preferably 6% or less. Stability of the glass can be obtained by keeping the content of the additional component to the small amount. The additional components include, for example, $ZrO_2$, $Al_2O_3$, MgO, CaO, SrO, BaO, $Sc_2O_3$, $Y_2O_3$, $La_2O_3$, $Ga_2O_3$, and $GeO_2$.

It is particularly preferred that the seventh glass does not substantially contain the additional component. In this description, the term "does not substantially contain" means that it is not intentionally used as a raw material, and for inevitable impurities mixed in from raw material components or production processes, it is regarded as "not contained".

The eighth glass of the present invention is a glass containing $(LiCl)_2$, $Li_2O$, and $B_2O_3$ as essential components, and containing substantially no $P_2O_5$, in which, when represented by mol %, the content of each component fulfills all of the above-mentioned requirements of (8-1) to (8-3). In the case where all of the requirements of (8-1) to (8-3) are fulfilled, the eighth glass of the present invention is high in stability as glass, and also excellent in ion conductivity.

In the requirement of (8-1), the ratio of the content of $(LiCl)_2$ to the content of $Li_2O$, which is represented by $(LiCl)_2/Li_2O$, of the eighth glass is 0.430 or more and 1.000 or less. In the case where $(LiCl)_2/Li_2O$ is 0.430 or more, high conductivity can be obtained. The ratio is preferably 0.440 or more, and more preferably 0.450 or more. In addition, in the case where the ratio is 1.000 or less, stability of the glass can be obtained. $(LiCl)_2/Li_2O$ is preferably 0.900 or less, and more preferably 0.800 or less.

In the eighth glass of the present invention, $(LiCl)_2/Li_2O$ indicates the ratio of Li which may coordinate with Cl (chlorine) among Li introduced as a cation, and in order to obtain high conductivity, it is effective to increase the ratio of Li which coordinates with Cl. However, in the case where the ratio is excessively increased, ion crystals of LiCl are formed in the glass to cause instability of the glass. Accordingly, in the eighth glass of the present invention, the composition is defined to fulfill the requirement of (8-1).

In the requirement of (8-2), the ratio of the content of $Li_2O$ to the content of $B_2O_3$, which is represented by $Li_2O/B_2O_3$, of the eighth glass is 0.95 or more and 1.05 or less. In the case where $Li_2O/B_2O_3$ is 0.95 or more, both high conductivity and stability of the glass can be satisfied. The ratio is preferably 0.96 or more, and more preferably 0.97 or more. In the case where $Li_2O/B_2O_3$ is 1.05 or less, both high conductivity and stability of the glass can be similarly satisfied. The ratio is preferably 1.04 or less, and more preferably 1.03 or less.

In addition, $Li_2O/B_2O_3$ indicates the ratio of Li to B which is a cation forming the glass, and in the case where the ratio is close to 1, nearly the same number of Li as B which becomes maximum coordinates to B tetra-coordinated with O (oxygen), in a form of charge compensation, which makes it easy to form a glass network structure of $BO_4$, and non-crosslinking oxygen which cleaves the glass network structure is less likely to be formed. Further, the amount of Li which is hard to electrically move can be minimized. Accordingly, in the eighth glass of the present invention, the composition is defined to fulfill the requirement of (8-2).

In the requirement of (8-3), the total content of $(LiCl)_2$, $Li_2O$ and $B_2O_3$, which is represented by $(LiCl)_2+Li_2O+B_2O_3$, of the eighth glass is 90% or more. In the case where the total content is 90% or more, both high conductivity and stability of the glass can be satisfied. The total content is preferably 92% or more, and more preferably 94% or more.

The eighth glass may contain an additional component other than $(LiCl)_2$, $Li_2O$, and $B_2O_3$. The content of the additional component is 10% or less, preferably 8% or less, and more preferably 6% or less. Stability of the glass can be obtained by keeping the content of the additional component to the small amount. The additional components include, for example, $ZrO_2$, $Al_2O_3$, MgO, CaO, SrO, BaO, $Sc_2O_3$, $Y_2O_3$, $La_2O_3$, $Ga_2O_3$, and $GeO_2$. It is particularly preferred that the eighth glass does not substantially contain the additional component.

In the glass of the present invention, when the crystallization peak temperature of the glass is taken as Tc and the glass transition point as Tg, (Tc−Tg) is preferably 55° C. or higher. For example, in the case where (Tc−Tg) is 55° C. or higher, the glass can have a dense and stable glass (amorphous) texture when a pulverized product thereof is sintered.

In the glass of the present invention, the grass transition point Tg is preferably 200° C. or more and 450° C. or less, more preferably 200 to 430° C., and still more preferably 200 to 400° C. When used as a binder glass for binding of a high-density circuit substrate, usually, the glass of the present invention is sintered at a temperature of higher than Tg and lower than Tc so that crystallization does not occur, and then used. In that case, as described later, a composition containing the glass of the present invention and an electrode material may be each pasted, and thereafter laminated and fired in a batch to prepare a laminated unit of the high-density circuit substrate such as a low-temperature co-fired ceramic multilayer substrate.

In that case, in the case where Tg is 450° C. or lower, a reaction between the glass and a constituent material such as the electrode material can be suppressed. From this viewpoint, the lower Tg is better. However, in the case of too low, a resin material used when the glass-containing composition is made into paste may be possibly inhibited from being thermally decomposed in firing. In the case where Tg is 200° C. or higher, the thermal decomposition inhibition of the resin material can be suppressed. As a result, the amount of a thermal decomposition residue which remains after the thermal decomposition of the resin material can be reduced. Therefore, foaming due to the thermal decomposition residue is suppressed, a dense sintered body can be obtained, and it becomes possible to obtain a high-density circuit substrate having high reliability.

Here, both Tg and Tc are temperatures specific to composition of glass, and can be determined by differential thermal analysis (DTA) of the glass, by using an inflection point, a peak, etc. of a DTA curve showing exothermic/endothermic amounts.

The glass of the present invention has a sufficiently high ion conductivity. The ion conductivity is preferably $7.0\times10^{-7}$ S/cm or more, more preferably $8.0\times10^{-7}$ S/cm or more, and particularly preferably $1.0\times10^{-6}$ S/cm or more.

In this description, the ion conductivity is a value obtained by AC impedance measurement at room temperature (from 20° C. to 25° C.). That is, the ion conductivity is measured by an AC impedance method, by using a sample having electrodes formed on both surfaces. Specifically, the ion conductivity is calculated from the arc diameter of Nyquist plots obtained by the AC impedance measurement under measuring conditions of an applied voltage of 50 mV and a measurement frequency range of 1 Hz to 1 MHz.

(Production Method of Glass of the Present Invention)

A production method of the glass of the present invention is not particularly limited. For example, the glass can be produced by a method described below.

First, a raw material mixture is prepared. The raw materials are not particularly limited, as long as they are materials used in the production of ordinary oxide glass, and oxides, carbonates, etc. can be used. The kinds and ratios of the raw materials are appropriately adjusted so that the above-mentioned composition range is achieved in the glass to be obtained, thereby obtaining a raw material composition.

Then, the raw material mixture is heated by a known method to obtain a molten material. The heating and melting temperature (melting temperature) is preferably from 900 to 1400° C., and more preferably from 1000 to 1300° C. The heating and melting time is preferably from 20 to 50 minutes, and more preferably from 30 to 40 minutes.

Thereafter, the molten material is cooled and solidified, thereby being able to obtain the glass of the present invention. A cooling method is not particularly limited. For example, cooling can be performed by using a rollout machine, a press machine or the like, and rapid cooling can also be performed, by dropping to a cooling liquid, or the like. The glass obtained is completely amorphous. That is, the degree of crystallinity is 0%.

The glass of the present invention thus obtained may have any form. For example, the glass may have a block form, a sheet form, a thin sheet form (flake form), a powdery form, or the like.

The glass of the present invention can be sintered at low temperatures, and is useful as a binder glass for binding, when a laminated ceramic capacitor or a high-density circuit substrate such as a low-temperature co-fired ceramic multilayer substrate is prepared. In addition, the glass of the present invention is useful as a solid electrolyte of a lithium-ion secondary battery, and the solid electrolyte of the present invention can be applied to a solid electrolyte of a metal-air battery or an all-solid battery.

(Composite)

The glass of the present invention may be combined with a crystal substance to be used as a composite. The composites include a composite containing one glass selected from the first glass to eighth glass of the present invention and a crystal substance, in which the crystal substance is contained in an amount of more than 0% by volume in total based on the total amount of the composite.

By containing the glass of the present invention and further containing the crystal substance, the composite can impart various necessary functionalities such as strength, control of thermal expansion coefficient, chemical durability, optical functions, ion conductivity, electron conductivity, and electrode functions.

The crystal substance contained in the composite may be either a crystal substance precipitated from the glass of the present invention or another crystal substance added, or may be both thereof. The composite containing the glass of the present invention and the crystal substance precipitated from the glass of the present invention can be produced, for example, by a method such as adding a sufficient thermal history during a production of the glass of the present invention, or heat-treating the glass of the present invention at Tc or higher or the like. The crystal substance precipitated from the glass of the present invention include, for example, ceramics and ion conductive crystals.

The content of the glass of the present invention in the composite is preferably the amount excluding the content of the crystal substance described below. The content of the crystal substance in the composite is, in total, more than 0% by volume, and preferably 1% by volume or more, based on the total amount of the composite. From the viewpoint of sinterability, the upper limit of the content is, in total, preferably 70% by volume or less, and more preferably 50% by volume or less, based on the total amount of the composite.

The composite can be sintered at low temperatures, and is useful as the binder for binding, when a laminated ceramic capacitor or a high-density circuit substrate such as a low-temperature co-fired ceramic multilayer substrate is prepared. In addition, the composite is useful as a solid electrolyte of a lithium-ion secondary battery, and the solid electrolyte of the present invention can be applied to a metal-air battery or an all-solid battery.

<Laminated Ceramic Capacitor>

A laminated ceramic capacitor or a capacitor is composed of a laminate in which a dielectric layer is arranged between electrode layers. Defining the above-mentioned laminate as one unit (hereinafter also referred to as a "lamination unit"), it may have a configuration including one lamination unit or a configuration including two or more lamination units laminated. Large electric capacity can be obtained while being small in size by making the dielectric layer thin to decrease the distance between the electrode layers and by laminating many lamination units.

FIG. 1 schematically illustrates one example of a configuration of the laminated ceramic capacitor. The laminated ceramic capacitor 10 is composed of a laminate in which dielectric layers 11 and internal electrode layers 12 are sequentially laminated (however, the lowermost layer and the uppermost layer are the dielectric layers 11) and a pair of external electrodes 13 for holding the laminate, and the internal electrode layers 12 are alternately connected to any one of the external electrodes 13. In such a laminated ceramic capacitor 10, the glass of the present invention is used, for example, in the formation of the dielectric layers 11. The laminated ceramic capacitor 10 is produced, for example, as described below.

A production method of the laminated ceramic capacitor is briefly described below. First, a functional ceramic necessary for composing the dielectric layers is selected. In the case of increasing the specific dielectric constant, a powder of barium titanate ($BaTiO_3$) or the like having a perovskite type structure may be prepared. A powder of the glass of the present invention is mixed therewith to obtain a mixed powder. The amount of the glass powder of the present invention added is desirably in a ratio of 1 to 10% by volume based on the total amount of the above-mentioned mixed powder.

Although there are a printing method and a green sheet method as a forming method of the laminated ceramic capacitor, the green sheet method is described as an example. The above-mentioned mixed powder, a vehicle obtained by dissolving a resin material in a solvent, a plasticizer and a dispersant are appropriately mixed to prepare a viscous liquid called a dielectric paste or slurry. The viscous liquid having relatively high viscosity is generally called the paste, and one having low viscosity is generally called the slurry. The dielectric paste or slurry can be formed into a sheet form by casting it by a doctor blade method or the like, on a film base material of PET (polyethylene terephthalate) or the like on which a surface treatment such as mold release treatment has been performed. A sheet obtained by evaporating the contained solvent by drying is one in which the above-mentioned mixed powder is adhesively bound by the resin material, etc., and is called a green sheet. A coating method of the paste or the slurry is not particularly limited, and known methods such as screen printing, transfer, and the doctor blade method can be adopted.

The following can be enumerated as the above-mentioned resin materials. For example, a polyvinyl butyral resin is suitable for enhancing stability of the paste or the slurry, and strength, flexibility, and thermocompression bonding properties during lamination, of the green sheet are easily obtained. However, this is poor in thermal decomposition properties, and particularly, when fired at low temperatures, a thermal decomposition residue is liable to remain, which causes a deterioration of sinterability of the green sheet, or a generation of blister to the sintered body due to a thermally decomposed gas thereof.

An acrylic or methacrylic resin tends to have good thermal decomposition properties, and is suitable for obtaining a good sintered body, particularly, when fired at low temperatures. On the other hand, strength, flexibility, and thermocompression bonding properties during lamination, of the green sheet are less likely to be obtained. However, this defect can be suppressed by copolymerizing monomers having various functional groups.

Additionally, polyethylene glycol, polyvinyl alcohol, ethylcellulose, methylcellulose, nitrocellulose, cellulose butyl acetate, cellulose propyl acetate, poly-α-methylstyrene, polypropylene carbonate, polyethylene carbonate, etc. can also be used.

Then, in order to form the internal electrode layer on a necessary portion on the green sheet, a conductive paste mainly composed of silver or cupper is formed by a coating technique such as screen printing or gravure printing. By adding the glass of the present invention also to this conductive paste, interlayer adhesion properties can be improved. Thereafter, the plurality of these sheets are laminated, and compression-bonded and integrated by appropriately applying heat and pressure to obtain a laminated sheet. The compression-bonding is performed with heating, and the heating temperature is, for example, from 40 to 80° C. The sheet is cut to be divided into individual pieces (chipped).

Individual pieces (chips) cut are heated in a predetermined atmosphere such as the atmosphere, an inert gas or a vacuum, by using a firing furnace, to burn the resin material component, etc., and thereafter sintered. Thus, a fired laminate can be obtained. The firing temperature is preferably within a temperature range between 30° C. higher than Tg of the glass of the present invention and lower than Tc of the glass. At a temperature lower than the lower limit of the above-mentioned firing temperature, the burning of the above-mentioned resin material component does not sufficiently proceed, so that the burning residue component inhibits the sintering, and sometimes the sintering does not sufficiently proceed. At a temperature higher than the upper limit, the glass is crystallized, and the sintering does not proceed. Moreover, thermal deterioration reaction of the functional ceramic or the electrode material is sometimes promoted, which is not preferable.

Specifically, the above-mentioned firing temperature is preferably from 280 to 600° C., and in terms of promotion of the firing and reduction in production cost, the firing temperature is more preferably within a range between 280 and 550° C. The firing time is, for example, from 1 to 3 hours.

Optionally, a conductive paste for forming the external electrode is applied on the fired laminate, dried and fired, and further optionally, Ni or Sn plating is applied thereto. The interlayer adhesion properties can be improved by adding the glass of the present invention also to the conductive paste. The laminated ceramic capacitor can be obtained by adopting such a method.

In the above-mentioned laminated ceramic capacitor, the above-mentioned composite may be used in place of the glass of the present invention. However, in the case where a mixed powder in which the functional ceramic, etc. necessary for composing the dielectric layer in the above and the composite are mixed is prepared, the mixed powder is preferably prepared so that the ratio of the glass contained in the composite is from 1 to 100/% by volume based on the total amount of the mixed powder, because the composite contains the crystal substance.

The firing at low temperatures becomes possible by using the glass or the composite of the present invention, so that the dense laminated ceramic capacitor can be stably obtained, even with the functional ceramic or electrode material which is easily deteriorated at high temperatures. By performing the batch firing, the laminated ceramic capacitor excellent in adhesion properties between the respective layers and excellent in dielectric performance or aging stability can be obtained.

<Low-Temperature Co-Fired Ceramic Multilayer Substrate>

The low-temperature co-fired ceramic multilayer substrate is composed of a laminate in which electrode wiring layers form three-dimensional wiring arranged isolatedly by insulator layers. Defining the above-mentioned laminate as one unit (hereinafter also referred to as a "lamination unit"), the substrate may have a configuration including one lamination unit or a configuration including two or more lamination units laminated. A complicated wiring substrate can be obtained while being small in size by making the insulator layers thin to decrease the distance between the electrode wiring layers and by laminating many lamination units.

Figure 2:
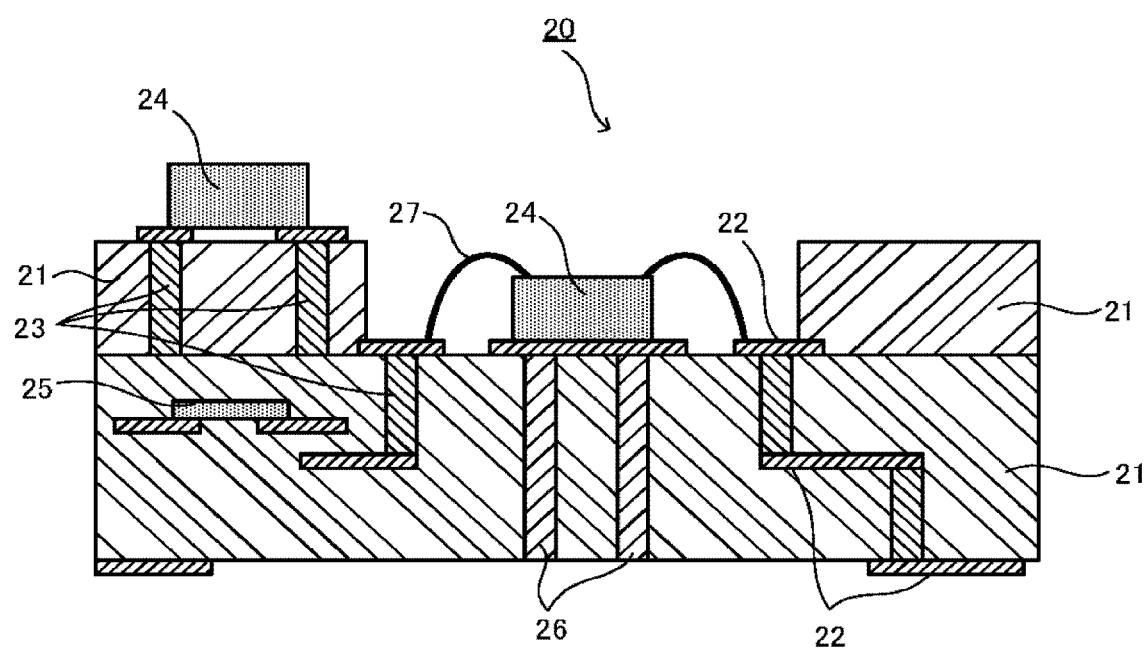
FIG. 2 is a view schematically illustrating an example in which a glass of the present invention is used in a low-temperature co-fired ceramic multilayer substrate.

FIG. 2 schematically illustrates one example of a configuration of the low-temperature co-fired ceramic multilayer substrate. The low-temperature co-fired ceramic multilayer substrate 20 illustrated in FIG. 2 has a substrate body composed of dielectric (insulator) layers 21, and has a plurality of flat electrodes 22 each having a main surface parallel to a main surface of the substrate body, inside and outside the substrate body. Further, it has internal vertical electrodes 23, each of which is arranged inside the substrate body so as to electrically connect the predetermined flat electrodes 22 to each other and has a main surface orthogonal to the main surface of the substrate body. In addition, an internal mounting component 25 is arranged inside the substrate body so as to come into contact with the (internal) flat electrodes 22, and a surface mounting component 24 is arranged so as to come into contact with the (external) flat electrodes 22. The surface mounting component 24 has electrodes, and the electrodes and the (external) flat electrodes 22 different from the above are electrically connected to each other by power feeding wires 27. The low-temperature co-fired ceramic multilayer substrate 20 has heat dissipation vias 26 passing through the substrate body, and the surface mounting component 24 is mounted just thereon.

In such a low-temperature co-fired ceramic multilayer substrate 20, the glass of the present invention is used, for example, in the formation of the dielectric layers 21. The low-temperature co-fired ceramic multilayer substrate 20 can be produced, for example, as described below.

A production method of the low-temperature co-fired ceramic multilayer substrate is briefly described below. A functional ceramic necessary for composing the dielectric layer is selected. In the case of increasing strength, alumina or the like is prepared, and the glass of the present invention is mixed therewith to obtain a mixed powder. The ratio of the glass powder of the present invention is desirably in a ratio of 40 to 70% by volume based on the total amount of the above-mentioned mixed powder.

Although there are a printing method and a green sheet method as a forming method of the low-temperature co-fired ceramic multilayer substrate, the green sheet method is described as an example. The above-mentioned mixed powder, the above-mentioned vehicle, the plasticizer and the dispersant are appropriately mixed to prepare a viscous liquid called a dielectric (insulator) paste or slurry. The dielectric paste or slurry can be formed into a sheet form by casting it by a doctor blade method or the like, on a film base material of PET or the like on which a surface treatment such as mold release treatment has been performed.

A sheet obtained by evaporating the contained solvent by drying is one in which the above-mentioned mixed powder is adhesively bound by the resin material, etc., and is called a green sheet. A coating method of the paste or the slurry is not particularly limited, and known methods such as screen printing, transfer and the doctor blade method can be adopted.

Then, in order to form internal wiring or, in the case of the outermost part, the flat electrode layer serving as external wiring, on a necessary portion on the green sheet, the conductive paste mainly composed of silver or cupper is formed by a coating technique such as screen printing or gravure printing. By adding the glass of the present invention also to this conductive paste, the interlayer adhesion properties can be improved. In the case where a resistor layer is formed, a resistor paste mainly composed of ruthenium oxide is formed by a coating technique such as screen printing or gravure printing.

The internal vertical electrode is formed by subjecting the green sheet to drilling processing beforehand, and hole-filling coating the conductive paste mainly composed of silver or copper to the drilled portion by screen printing or the like. The heat dissipation via is also similarly formed by subjecting the green sheet to drilling processing beforehand, and hole-filling coating a paste composed of high thermal conductive materials mainly composed of silver or copper to the drilled portion by screen printing or the like. In addition, the internal mounting component may be optionally mounted.

Thereafter, the plurality of these sheets are laminated, and compression-bonded and integrated by appropriately applying heat and pressure to obtain a laminated sheet. The compression-bonding is performed with heating, and the heating temperature is, for example, from 40 to 80° C. The laminated sheet is heated in a predetermined atmosphere such as the atmosphere, an inert gas or a vacuum, by using a firing furnace, to burn the resin material component, etc., and thereafter sintered. Thus, a fired laminate can be obtained. The firing temperature is preferably within a temperature range between 30° C. higher than Tg of the glass of the present invention and lower than Tc of the glass. At a temperature lower than the lower limit of the above-mentioned firing temperature, the burning of the above-mentioned resin material component does not sufficiently proceed, so that the burning residue component inhibits the sintering, and sometimes the sintering does not sufficiently proceed. At a temperature higher than the upper limit, the glass is crystallized, and the sintering does not proceed. Moreover, thermal deterioration reaction of the functional ceramic or the electrode material is sometimes promoted, which is not preferable.

Specifically, the above-mentioned firing temperature is preferably from 280 to 600° C., and in terms of promotion of the firing and reduction in production cost, the firing temperature is more preferably within a range between 280 and 550° C. The firing time is, for example, from 1 to 3 hours.

Optionally, Ni or Au plating is applied to a portion to serve as the external electrode of the fired laminate. In addition, optionally, the laminated sheet before the firing is half cut, and divided after the firing to be chipped, or chipped by using a dicing saw or the like. The low-temperature co-fired ceramic multilayer substrate can be obtained by adopting such a method. Furthermore, for example, the power feeding wires for connecting the surface mounting component or the electrodes of the surface mounting component and the external electrodes to each other are provided on the external electrodes.

In the above-mentioned low-temperature co-fired ceramic multilayer substrate, the above-mentioned composite may be used in place of the glass of the present invention. However, in the case where a mixed powder in which the functional ceramic, etc. necessary for composing the dielectric layer in the above and the composite are mixed is prepared, the mixed powder is preferably prepared so that the ratio of the glass contained in the composite is from 40 to 70% by volume based on the total amount of the mixed powder, because the composite contains the crystal substance.

The firing at low temperatures becomes possible by using the glass or the composite of the present invention, so that the dense low-temperature co-fired ceramic multilayer substrate is stably obtained, even with the functional ceramic or electrode material which is easily deteriorated at high temperatures. By performing the batch firing, the low-temperature co-fired ceramic multilayer substrate excellent in adhesion properties between the respective layers, high in reliability and excellent in aging stability can be obtained.

<Solid Electrolyte>

The solid electrolyte of the present invention contains the glass of the present invention. The solid electrolyte may optionally contain a component other than the glass within a range not impairing the effect of the present invention. The other components which can be contained include ion conductive crystals, etc. The ratio of the glass of the present invention contained in the solid electrolyte is preferably from 40 to 100% by volume, more preferably from 70 to 100% by volume, and still more preferably 100% by volume.

In the above-mentioned solid electrolyte, the above-mentioned composite may be used in place of the glass of the present invention. However, in the case where the composite already contains a sufficient amount of a crystal component for the solid electrolyte, such as the ion conductive crystals, it is unnecessary to further add such a crystal component to the solid electrolyte.

<All-Solid Lithium-Ion Secondary Battery>

An all-solid lithium-ion secondary battery is a lithium-ion secondary battery having a positive electrode, a negative electrode, and a solid electrolyte layer arranged between the positive electrode and the negative electrode. The solid electrolyte of the present invention is suitable for this solid electrolyte layer. Defining the laminate in which the positive electrode and the negative electrode are arranged to sandwich the solid electrolyte layer therebetween as one unit (hereinafter referred to as a "lamination unit"), the battery may have a configuration including one lamination unit or a configuration including two or more lamination units laminated. Large energy density can be obtained while being small in size by making the solid electrolyte layer thin to decrease the distance between the electrode layers and by laminating many lamination units.

In the lithium-ion secondary battery, the solid electrolyte layer is composed of the solid electrolyte of the present invention, so that the lithium-ion secondary battery excellent in formability, for example, having a lamination structure in which the plurality of the above-mentioned lamination units are laminated (hereinafter also referred to as a "multilayer structure") can be easily prepared. In particular, the lithium-ion secondary battery having the multilayer structure can be prepared by the batch firing described later, thereby being excellent in adhesion properties between the respective layers. Therefore, a lithium-ion secondary battery having excellent battery performance and aging stability can be obtained.

Figure 3:
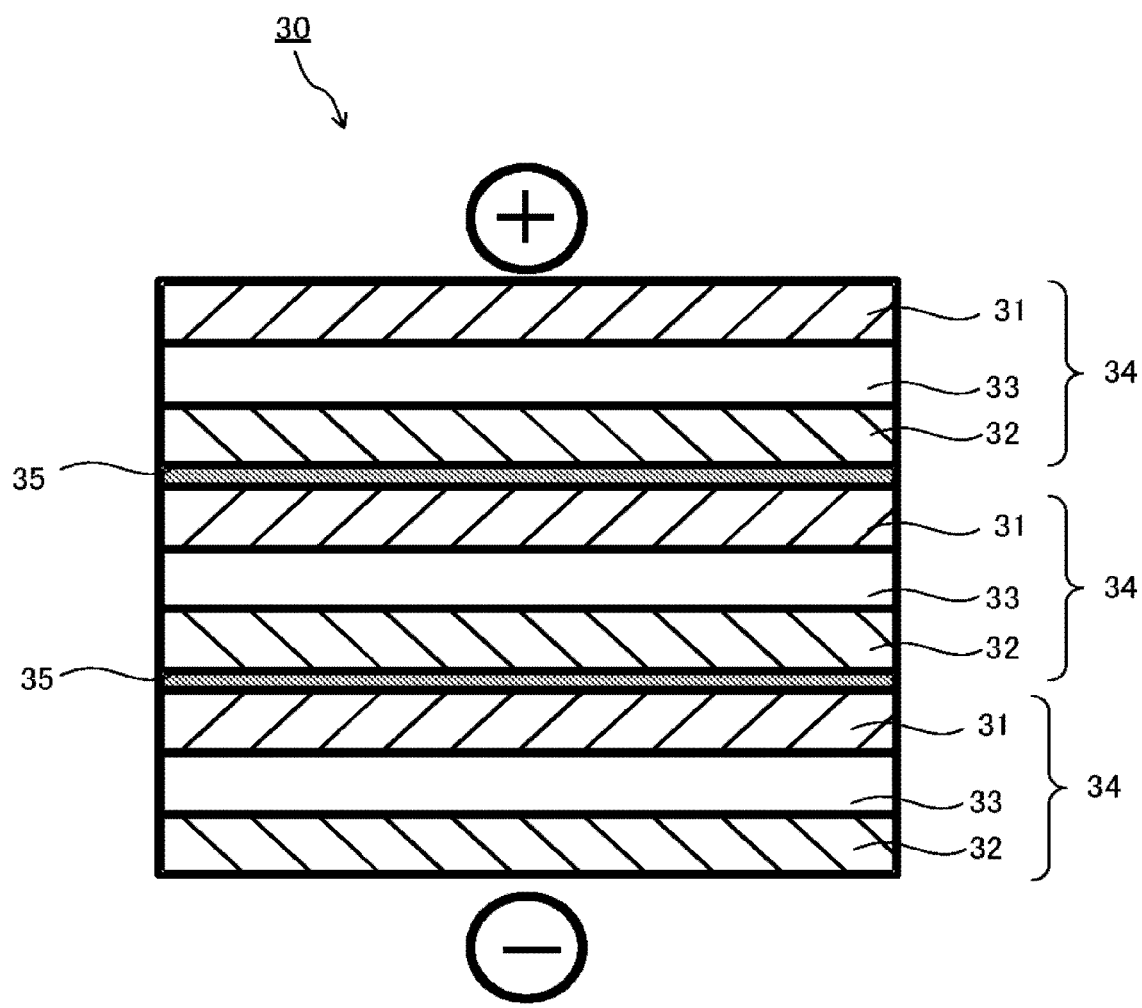
FIG. 3 is a view schematically illustrating an example in which a glass of the present invention is used in a lithium-ion secondary battery.

FIG. 3 schematically illustrates a multilayer, all-solid and serial lithium-ion secondary battery as one example of a configuration of the lithium-ion secondary battery.

As illustrated in FIG. 3, the lithium-ion secondary battery 30 has a structure in which a plurality of lamination units 34 each having a positive electrode (cathode electrode) 31, a negative electrode (anode electrode) 32 and a solid electrolyte layer 33 arranged between the positive electrode 31 and the negative electrode 32 are laminated through electron conductor layers 35 and connected in series. In FIG. 3, the signs "+" and "−" in circles indicate a positive electrode terminal and a negative electrode terminal, respectively.

For example, $LiCoO_2$, $LiMn_2O_4$, $LiFePO_4$ or the like is used for the positive electrode 31, and, for example, metal lithium, graphite, $Li_4Ti_5O_{12}$ or the like is used for the negative electrode 32. However, these are only examples, and other electrode materials may be used for the positive electrode 31 and the negative electrode 32.

In addition, in the multilayer, all-solid and serial lithium-ion secondary battery 30 as illustrated in FIG. 3, the lamination unit 34 may have a layer other than the above. Further, the lithium-ion secondary battery 30 may have a layer other than the lamination unit 34 and the electron conductor layer 35.

Furthermore, in the case where a multilayer and all-solid lithium-ion secondary battery is formed in parallel, for example, in the serial lithium-ion secondary battery 30 illustrated in FIG. 3, the electron conductor layers 35 are changed to insulator layers, the respective positive electrodes 31 in the respective lamination units 34 are collectively connected to the positive electrode terminal through wiring (positive electrode wiring), and further, the respective negative electrodes 32 in the respective lamination units 34 are collectively connected to the negative electrode terminal through wiring (negative electrode wiring).

The lithium-ion secondary battery in which the solid electrolyte layer is composed of the solid electrolyte containing the glass of the present invention is nonflammable, has high safety, and moreover, has high stability against voltage application, compared with a battery using a conventional organic solvent-based liquid electrolyte. In addition, the glass contained in the solid electrolyte has high sinterability and high stability, so that production thereof is easy. Furthermore, the glass has a sufficiently high ion conductivity, so that good battery performance is exhibited.

By using the multilayer and all-solid lithium-ion secondary battery illustrated in FIG. 3 as an example, a production method thereof is described below. The lithium-ion secondary battery 30 can be produced, for example, by separately producing the respective layers of the positive electrodes 31, the negative electrodes 32, the solid electrolyte layers 33 and the electron conductor layers 35 composing this battery, thereafter laminating them in the order shown in FIG. 3, and integrating them by compression-bonding under heating, etc.

In addition, the lithium-ion secondary battery 30 can also be produced, for example, by making into paste or slurry based on a positive electrode active material for composing the positive electrodes 31, the solid electrolyte for composing the solid electrolyte layers 33, a negative electrode active material for composing the negative electrodes 32, and an electron conductive material for composing the electron conductor layers 35, respectively, applying and drying them to prepare green sheets, laminating such green sheets in the order shown in FIG. 3, and subjecting them to the batch firing.

Although a method of the pasting is not particularly limited, for example, the paste can be obtained by mixing a powder of each material described above with the above-mentioned vehicle. The coating method of the paste or the slurry is not particularly limited, and a known method such as die coating, screen printing, transfer, or a doctor blade method can be adopted. When a flat pattern is to be formed, the above-mentioned green sheets may be subjected to punching or cutting, or a technique of applying the paste to a base material by screen printing or gravure printing may be used. In the production method of the lithium-ion secondary battery, it is preferred to adopt the batch firing.

The prepared respective green sheets for the positive electrode 31, for the solid electrolyte layer 33, for the negative electrode 32, and for the electron conductor layer 35 are laminated in the order shown in FIG. 3, and optionally subjected to alignment, cutting, etc. to prepare the laminate. Optionally, the lamination may be performed, after alignment is performed so that an edge face of the positive electrode and an edge face of the negative electrode do not coincide with each other.

Then, the prepared laminate is compression-bonded in a batch. The compression-bonding is performed under heating, and the heating temperature is, for example, from 40 to 80° C. The compression-bonded laminate is fired, for example, by heating in the air atmosphere. The firing temperature is preferably within a temperature range between 30° C. higher than Tg of the lithium-ion conductive glass contained in the solid electrolyte and lower than Tc of the glass. At a temperature lower than the lower limit of the above-mentioned firing temperature, the burning of the above-mentioned resin material component does not sufficiently proceed, so that the burning residue component inhibits the sintering, and sometimes the firing does not sufficiently proceed. At a temperature higher than the upper limit, the glass contained in the solid electrolyte is crystallized to inhibit the sintering, which is not preferable.

Specifically, the above-mentioned firing temperature is preferably from 280 to 600° C., and in terms of promotion of the firing and reduction in production cost, the firing temperature is more preferably within a range of 280 to 550° C. The firing time is, for example, from 1 to 3 hours.

In the production of the lithium-ion secondary battery 30 with the multilayer structure by the above-mentioned batch firing, there may be adopted a method of performing the batch firing for the lamination unit 34 composed of the positive electrode 31, the solid electrolyte layer 33, and the negative electrode 32 in each unit in the same manner as described above, laminating the lamination units 34 obtained through the electron conductor layer 35 paste, and performing the firing according to firing conditions of the electron conductor layer 35 paste.

EXAMPLES

The present invention is specifically described below with reference to Working Examples. However, the present invention is not limited to the Working Examples. For glasses, Examples 1 to 8 and Examples 11 to 34 are Working Examples, and Examples 9 and 10 are Comparative Examples.

Examples 1 to 10

Respective raw material powders were weighed and mixed so as to attain charge compositions shown in Table 1. As the raw materials, $Li_2CO_3$, $SiO_2$, $B_2O_3$, LiCl, and $Li_2S$ were used in combination. Then, the mixed raw materials were placed in a platinum crucible, and heated at 1000° C. for 30 minutes to melt the raw materials. Thereafter, the melted raw materials were rapidly cooled with a rollout machine to prepare a flake-shaped (flake) glass (hereinafter referred to as a glass flake). The glass flake obtained was observed under a microscope. As a result, no crystal substance was found in all of the glass flakes.

Examples 11 to 34

Respective raw material powders were weighed and mixed so as to attain charge compositions shown in Tables 2 to 4. As the raw materials, $Li_2CO_3$, $SiO_2$, $B_2O_3$, $P_2O_5$, and LiCl were used in combination. Then, the mixed raw materials were placed in a platinum crucible, and heated at 900° C. for 20 minutes to melt the raw materials. Thereafter, the melted raw materials were rapidly cooled with the rollout machine to prepare a glass flake. The glass flake obtained was observed under the microscope. As a result, no crystal substance was found in all of the glass flakes.

In addition, for the glass flakes obtained, DTA measurement was performed by the following method to determine the glass transition point (Tg) and the crystallization peak temperature (Tc), respectively. Furthermore, the ion conductivity of the glass flakes was measured by the following method.

(DTA Measurement)

The glass flake obtained was pulverized by using a mortar to such a particle size capable of being put into a DTA cell having an inner diameter of 5 mm to prepare a glass powder, which was used in the DTA measurement. The DTA measurement was performed by using a differential thermal analyzer (manufactured by Rigaku Corporation, product name: TG8110). Tg and Tc were determined from a DTA curve obtained. These results are shown in the lower columns of Tables 1 to 4. In addition, the values of (Tc−Tg) are also shown in the lower columns of Tables 1 to 4.

(Measurement of Ion Conductivity)

Gold electrodes (diameter: 6 mm) were formed by a vapor deposition method on both surfaces of the glass flake obtained. Then, a measurement voltage of 50 mV was applied to the above-mentioned gold electrodes, and the impedance of the glass flake was measured by an AC impedance method. In the measurement, Solartron SI 1287 (manufactured by Solartron) provided with a FRA (frequency response analyzer) was used, and the measurement frequency was set to be from $10^7$ Hz to 0.1 Hz. The ion conductivity was determined from the arc diameter determined by Nyquist plots. The measurement results are shown in the lower columns of Tables 1 to 4.

TABLE 1

| | | | EX. 1 | EX. 2 | EX. 3 | EX. 4 | EX. 5 | EX. 6 | EX. 7 | EX. 8 | EX. 9 | EX. 10 |
|---|---|---|---|---|---|---|---|---|---|---|---|---|
| Composition | Cation % | $Li^+$ | 76.3 | 76.0 | 77.5 | 79.3 | 76.0 | 52.9 | 56.7 | 60.6 | 77.5 | 57.2 |
| | | $Si^{4+}$ | 7.3 | 14.3 | 6.9 | 6.4 | 7.3 | 4.6 | 3.1 | 1.5 | 6.8 | 5.8 |
| | | $B^{3+}$ | 16.4 | 9.7 | 15.6 | 14.3 | 16.7 | 42.5 | 40.2 | 37.9 | 15.7 | 37.0 |
| | | Total | 100 | 100 | 100 | 100 | 100 | 100 | 100 | 100 | 100 | 100 |
| | Anion % | $O^{2-}$ | 86.8 | 83.3 | 98.4 | 97.1 | 95.4 | 88.7 | 84.9 | 77.7 | 100 | 100 |
| | | $Cl^-$ | 13.2 | 16.7 | 0.0 | 0.0 | 4.6 | 11.3 | 15.1 | 22.3 | 0.0 | 0.0 |
| | | $S^{2-}$ | 0.0 | 0.0 | 1.6 | 2.9 | 0.0 | 0.0 | 0.0 | 0.0 | 0.0 | 0.0 |
| | | Total | 100 | 100 | 100 | 100 | 100 | 100 | 100 | 100 | 100 | 100 |
| Physical Properties | Tg[° C.] | | 213 | 249 | 280 | 245 | 252 | 364 | 353 | 329 | 304 | 362 |
| | Tc[° C.] | | 297 | 328 | 357 | 308 | 344 | 454 | 457 | 393 | 354 | 474 |
| | Tc − Tg[° C.] | | 84 | 79 | 77 | 63 | 92 | 90 | 105 | 64 | 50 | 112 |
| | Ion Conductivity [S/cm] | | $1.7 \times 10^{-6}$ | $4.4 \times 10^{-5}$ | $3.5 \times 10^{-6}$ | $1.5 \times 10^{-6}$ | $8.1 \times 10^{-7}$ | $3.0 \times 10^{-6}$ | $4.4 \times 10^{-6}$ | $7.5 \times 10^{-6}$ | $2.7 \times 10^{-6}$ | $4.9 \times 10^{-7}$ |

TABLE 2

| | | EX. 11 | EX. 12 | EX. 13 | EX. 14 | EX. 15 | EX. 16 | EX. 17 | EX. 18 | EX. 19 | EX. 20 |
|---|---|---|---|---|---|---|---|---|---|---|---|
| Composition [mol%] | $Li_2O$ | 40 | 40 | 40 | 40 | 40 | 40 | 38.5 | 40 | 41 | 40 |
| | $(LiCl)_2$ | 15 | 15 | 20 | 20 | 20 | 20 | 22.5 | 20 | 18 | 18 |
| | $SiO_2$ | 6 | 6 | 1 | 0.5 | 0.5 | 1 | 0 | 0 | 0 | 0 |
| | $B_2O_3$ | 38.5 | 38 | 20 | 20 | 19.5 | 19 | 38.5 | 39.5 | 40.5 | 41.5 |
| | $P_2O_5$ | 0.5 | 1 | 19 | 19.5 | 20 | 20 | 0.5 | 0.5 | 0.5 | 0.5 |
| | Total | 100 | 100 | 100 | 100 | 100 | 100 | 100 | 100 | 100 | 100 |
| Composition Ratio | $Li_2O/(B_2O_3 + P_2O_5)$ | 1.03 | 1.03 | 1.03 | 1.01 | 1.01 | 1.03 | 0.99 | 1.00 | 1.00 | 0.95 |
| | $P_2O_5/(B_2O_3 + P_2O_5)$ | 0.01 | 0.03 | 0.49 | 0.49 | 0.51 | 0.51 | 0.01 | 0.01 | 0.01 | 0.01 |
| Physical Properties | Tg[° C.] | 354 | 356 | 312 | 307 | 309 | 307 | 328 | 331 | 337 | 342 |
| | Tc[° C.] | 478 | 485 | 396 | 413 | 402 | 404 | 387 | 395 | 424 | 443 |
| | Tc − Tg[° C.] | 125 | 129 | 84 | 107 | 93 | 97 | 60 | 65 | 87 | 101 |
| | Ion Conductivity [S/cm] | $2.5 \times 10^{-6}$ | $3.1 \times 10^{-6}$ | $6.8 \times 10^{-6}$ | $7.2 \times 10^{-6}$ | $7.6 \times 10^{-6}$ | $7.3 \times 10^{-6}$ | $1.1 \times 10^{-5}$ | $5.8 \times 10^{-6}$ | $5.0 \times 10^{-6}$ | $4.9 \times 10^{-6}$ |

TABLE 3

| | | EX. 21 | EX. 22 | EX. 23 | EX. 24 | EX. 25 | EX. 26 | EX. 27 | EX. 28 | EX. 29 |
|---|---|---|---|---|---|---|---|---|---|---|
| Composition [mol %] | $Li_2O$ | 42.5 | 40 | 41 | 42.5 | 39 | 39.4 | 40 | 40 | 40 |
| | $(LiCl)_2$ | 15 | 18 | 18 | 15 | 22 | 21 | 20 | 20 | 20 |
| | $SiO_2$ | 0 | 0 | 0 | 0 | 0 | 0 | 0 | 0 | 0 |

TABLE 3-continued

|  |  | EX. 21 | EX. 22 | EX. 23 | EX. 24 | EX. 25 | EX. 26 | EX. 27 | EX. 28 | EX. 29 |
|---|---|---|---|---|---|---|---|---|---|---|
|  | $B_2O_3$ | 42 | 41 | 40 | 41.5 | 19.5 | 19.8 | 20 | 20 | 15 |
|  | $P_2O_5$ | 0.5 | 1 | 1 | 1 | 19.5 | 19.8 | 20 | 20 | 25 |
|  | Total | 100 | 100 | 100 | 100 | 100 | 100 | 100 | 100 | 100 |
| Composition | $Li_2O/(B_2O_3 + P_2O_5)$ | 1.00 | 0.95 | 1.00 | 1.00 | 1.00 | 0.99 | 1.00 | 1.00 | 1.00 |
| Ratio | $P_2O_5/(B_2O_3 + P_2O_5)$ | 0.01 | 0.02 | 0.02 | 0.02 | 0.50 | 0.50 | 0.50 | 0.50 | 0.63 |
| Physical | $Tg[° C.]$ | 349 | 347 | 339 | 350 | 299 | 306 | 307 | 311 | 307 |
| Properties | $Tc[° C.]$ | 454 | 462 | 436 | 446 | 392 | 399 | 416 | 409 | 394 |
|  | $Tc - Tg[° C.]$ | 106 | 115 | 97 | 95 | 93 | 93 | 109 | 98 | 88 |
|  | Ion Conductivity [S/cm] | $2.9 \times 10^{-6}$ | $4.7 \times 10^{-6}$ | $4.9 \times 10^{-6}$ | $3.0 \times 10^{-6}$ | $9.4 \times 10^{-6}$ | $8.9 \times 10^{-6}$ | $6.0 \times 10^{-6}$ | $7.2 \times 10^{-6}$ | $7.4 \times 10^{-6}$ |

TABLE 4

|  |  | EX. 30 | EX. 31 | EX. 32 | EX. 33 | EX. 34 |
|---|---|---|---|---|---|---|
| Composition | $Li_2O$ | 41 | 40 | 40 | 39 | 38 |
| [mol %] | $(LiCl)_2$ | 18 | 18 | 20 | 22 | 24 |
|  | $SiO_2$ | 0 | 0 | 0 | 0 | 0 |
|  | $B_2O_3$ | 41 | 42 | 40 | 39 | 38 |
|  | $P_2O_5$ | 0 | 0 | 0 | 0 | 0 |
|  | Total | 100 | 100 | 100 | 100 | 100 |
| Composition | $(LiCl)_2/Li_2O$ | 0.439 | 0.450 | 0.500 | 0.564 | 0.632 |
| Ratio | $Li_2O/B_2O_3$ | 1.00 | 0.95 | 1.00 | 1.00 | 1.00 |
| Physical | $Tg[° C.]$ | 334 | 347 | 337 | 328 | 319 |
| Properties | $Tc[° C.]$ | 413 | 443 | 429 | 385 | 378 |
|  | $Tc - Tg[° C.]$ | 80 | 96 | 92 | 58 | 59 |
|  | Ion Conductivity [S/cm] | $4.6 \times 10^{-6}$ | $4.9 \times 10^{-6}$ | $4.9 \times 10^{-6}$ | $7.3 \times 10^{-6}$ | $1.2 \times 10^{-5}$ |

While the present invention has been described in detail with reference to specific embodiments thereof, it is apparent to those skilled in the art that various changes and modifications can be made without departing from the spirit and scope of the present invention. The present application is based on Japanese Patent Application (No. 2016-160172) filed on Aug. 17, 2016 and Japanese Patent Application (No. 2017-150677) filed on Aug. 3, 2017, the entire contents of which are incorporated herein by reference. In addition, all references cited herein are incorporated by reference in their entireties.

INDUSTRIAL APPLICABILITY

According to the present invention, a glass which can be sintered at low temperatures and a composite containing the glass can be obtained, and a high-density circuit substrate fired at low-temperatures can be realized. In addition, a glass which is nonflammable, has high stability against voltage application and also has an excellent ion conductivity, and a composite containing the glass can be obtained. By using a solid electrolyte containing the glass or the composite, a lithium-ion secondary battery which is safe, has high stability against voltage application and has high battery performance can be realized.

DESCRIPTION OF REFERENCE NUMERALS AND SIGNS

10: Laminated ceramic capacitor
11: Dielectric layer
12: Internal electrode layer
13: External electrode
20: Low-temperature co-fired ceramic multilayer substrate
21: Dielectric (insulator) layers
22: Flat electrodes (internal and external)
23: Internal vertical electrode
24: Surface mounting component
25: Internal mounting component
26: Heat dissipation via
27: Power feeding wire
30: Lithium-ion secondary battery
31: Positive electrode (cathode electrode)
32: Negative electrode (anode electrode)
33: Solid electrolyte layer
34: Lamination unit
35: Electron conductor layer

The invention claimed is:
1. A glass,
comprising, as represented by cation %:
50% or more and less than 72% of $Li^+$,
more than 0% and 7% or less of $Si^{4+}$, and
more than 21% and 50% or less of $B^{3+}$, and,
comprising, as represented by anion %:
70% or more and less than 100% of $O^{2-}$ and
more than 0% and 30% or less of $Cl^-$.
2. The glass according to claim 1, having an ion conductivity of $7.0 \times 10^{-7}$ S/cm or more.
3. The glass according to claim 1, having a glass transition point of 200° C. or higher and 450° C. or lower.
4. The glass according to claim 1, having a crystallization peak temperature of Tc and a glass transition temperature of Tg, satisfying (Tc-Tg) of 55° C. or higher.

5. A solid electrolyte comprising the glass according to claim 1.

6. A binder for binding comprising the glass according to claim 1.

* * * * *